(12) United States Patent
Ide et al.

(10) Patent No.: US 9,252,299 B2
(45) Date of Patent: Feb. 2, 2016

(54) SOLAR CELL MODULE, SOLAR CELL AND SOLAR CELL MODULE MANUFACTURING METHOD

(75) Inventors: Daisuke Ide, Kobe (JP); Hitoshi Sakata, Kobe (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 927 days.

(21) Appl. No.: 13/060,233

(22) PCT Filed: Jun. 29, 2009

(86) PCT No.: PCT/JP2009/061848
§ 371 (c)(1),
(2), (4) Date: Jun. 15, 2011

(87) PCT Pub. No.: WO2010/021204
PCT Pub. Date: Feb. 25, 2010

(65) Prior Publication Data
US 2011/0277817 A1    Nov. 17, 2011

(30) Foreign Application Priority Data

Aug. 22, 2008 (JP) .................. 2008-214525

(51) Int. Cl.
*H01L 31/0232* (2014.01)
*H01L 31/0224* (2006.01)
*H01L 31/048* (2014.01)
*H01L 31/05* (2014.01)
*H01L 31/054* (2014.01)

(52) U.S. Cl.
CPC ...... *H01L 31/022441* (2013.01); *H01L 31/048* (2013.01); *H01L 31/0516* (2013.01); *H01L 31/0547* (2014.12); *Y02E 10/52* (2013.01)

(58) Field of Classification Search
CPC ............. H01L 31/022441; H01L 31/048; H01L 31/05; H01L 31/0516; H01L 31/0522; H01L 31/072
See application file for complete search history.

(56) References Cited

U.S. PATENT DOCUMENTS

| | | | |
|---|---|---|---|
| 4,838,952 A * | 6/1989 | Dill ............. | H01L 31/03529 136/256 |
| 5,961,742 A | 10/1999 | Tange et al. | |
| 6,384,317 B1 * | 5/2002 | Kerschaver ...... | H01L 31/03529 136/244 |
| 2006/0219291 A1* | 10/2006 | Hikosaka ............ | H02S 40/34 136/251 |
| 2008/0276981 A1* | 11/2008 | Kinoshita et al. ........... 136/244 | |
| 2009/0139570 A1* | 6/2009 | Kinoshita ......... | H01L 31/03762 136/256 |
| 2010/0275964 A1* | 11/2010 | Kinoshita ....... | H01L 31/022433 136/244 |
| 2010/0275987 A1 | 11/2010 | Sakamoto et al. | |

FOREIGN PATENT DOCUMENTS

| | | |
|---|---|---|
| EP | 2104147 A1 | 9/2009 |
| JP | 56-010976 A | 2/1981 |
| JP | 2005-011869 A | 1/2005 |
| JP | 2007-281044 A | 10/2007 |
| JP | 2007-281156 A | 10/2007 |
| JP | 2008-091697 A | 4/2008 |
| WO | 2008/078771 A1 | 7/2008 |
| WO | 2008/090718 A | 7/2008 |

* cited by examiner

*Primary Examiner* — Golam Mowla
(74) *Attorney, Agent, or Firm* — Marvin A. Motsenbocker; Mots Law, PLLC (57) ABSTRACT

A solar cell module 100 comprises a light reflection member 12 placed on the light receiving surface of a n-type semiconductor substrate 11 and having a light reflecting surface 12A facing the light receiving surface protection member 2. The light reflection member 12 is positioned on an opposite side to the n-side connecting electrode 14n across the n-type semiconductor substrate 11.

3 Claims, 12 Drawing Sheets

ARRAY DIRECTION H

SOLAR CELL MODULE, SOLAR CELL AND SOLAR CELL MODULE MANUFACTURING METHOD

TECHNICAL FIELD

The present invention relates to a solar cell module including back junction solar cells, a solar cell and a solar cell module manufacturing method.

BACKGROUND ART

Solar cells are expected as new energy sources owing to their capability of directly converting clean and inexhaustibly-supplied sunlight into electricity. In general, the output power per solar cell is several watts. Accordingly, for use of such a solar cell as a power source (energy source) for a house, a building, or the like, a solar cell module is used which is capable of providing higher output power by use of a plurality of solar cells electrically connected to each other.

In this respect, a so-called back junction solar cell has been proposed in which a plurality of n-side fine-line electrodes and a plurality of p-side fine-line electrodes are alternately formed on a back surface of a semiconductor substrate for the purpose of enlarging a light receiving area (see Japanese Patent Application Publication No. 2005-11869). The plurality of n-side fine-line electrodes are connected to an n-side connecting electrode formed on one end portion of the semiconductor substrate. The plurality of p-side fine-line electrodes are connected to a p-side connecting electrode formed on the opposite end portion of the semiconductor substrate. One solar cell and another solar cell next to the one solar cell are electrically connected in series with the n-side connecting electrode of the one solar cell and the p-side connecting electrode of the next solar cell connected to each other through a wiring member.

In a case where a semiconductor substrate is of a first conductivity type, however, the connecting electrode of the first conductivity type has a problem of poor efficiency of collecting majority carriers.

Specifically, in a solar cell including an n-type semiconductor substrate, for example, many of holes (minority carriers) generated around the n-side connecting electrode are recombined with electrons (majority carriers) before being diffused into the p-side fine-line electrodes. As a result, the number of electrons collected by the n-side connecting electrode is reduced.

Since the first conductivity side connecting electrode cannot efficiently collect carriers as described above, incident light falling on a region of the light receiving surface on an opposite side to the first conductivity side connecting electrode cannot utilized effectively.

The present invention has been made in consideration of the above problem, and an objective thereof is to provide a solar cell module including solar cells capable of effective use of incident light, a solar cell and a solar cell module manufacturing method.

SUMMARY OF THE INVENTION

A solar cell module according to a feature of the present invention is summarized as a solar cell module including one solar cell sealed between a light receiving surface protection member and a back surface protection member. The one solar cell includes a semiconductor substrate of a first conductivity type having a light receiving surface and a back surface provided on an opposite side to the light receiving surface; a first conductivity side connecting electrode formed on the back surface and connected to a plurality of first conductivity side fine-line electrodes; a second conductivity side connecting electrode formed on the back surface and connected to a plurality of second conductivity side fine-line electrodes; and a light reflection member placed on the light receiving surface and having a light reflecting surface facing the light receiving surface protection member. In the one solar cell, the light reflection member is positioned on an opposite side to the first conductivity side connecting electrode across the semiconductor substrate. In the present invention, reflection means regular reflection by a mirror surface or the like, and diffused reflection by scattered reflection or the like.

In the solar cell module according to the feature of the present invention, incident light falling on a region of the light receiving surface on the opposite side to the first conductivity side connecting electrode is guided to a region other than the region on the opposite side to the first conductivity side connecting electrode. This structure can suppress generation of photogenerated carriers in the proximity of the first conductivity side connecting electrode, and can promote generation of photogenerated carriers in the proximity of the second conductivity side connecting electrode. In the proximity of fine-line electrodes, photogenerated carriers, even minority carriers having a short diffusion length, is prevented from being recombined because the distance to the second conductivity side connecting electrode is short. Therefore, incident light falling on the region on the opposite side to the first conductivity side connecting electrode can be effectively utilized.

In the solar cell module according to the feature of the present invention, the first conductivity side connecting electrode may be formed on one end portion of the semiconductor substrate, and the light reflection member may reflect incident light falling on the light reflection member toward another end portion of the semiconductor substrate.

The solar cell module according to the feature of the present invention may comprise another solar cell sealed between the light receiving surface protection member and the back surface protection member, wherein the other solar cell may comprise: a semiconductor substrate of a first conductivity type having a light receiving surface and a back surface provided on an opposite side to the light receiving surface; a first conductivity side connecting electrode formed on the back surface and connected to a plurality of first conductivity side fine-line electrodes; a second conductivity side connecting electrode formed on the back surface and connected to a plurality of second conductivity side fine-line electrodes; and a light reflection member placed on the light receiving surface and having a light reflecting surface facing the light receiving surface protection member, in the other solar cell, the light reflection member may be positioned on an opposite side to the first conductivity side connecting electrode across the semiconductor substrate, and the light reflection member included in the one solar cell and the light reflection member included in the other solar cell may be formed integrally as a single unit.

In the solar cell module according to the feature of the present invention, the light reflecting surface may be made of any one of a metal layer and a white resin.

In the solar cell module according to the feature of the present invention, the light reflection plate may include a base bonded to the light receiving surface.

A solar cell according to a feature of the present invention is summarized as comprising: a semiconductor substrate of a first conductivity type having a light receiving surface and a back surface provided on an opposite side to the light receiving surface; a first conductivity side connecting electrode formed on the back surface and connected to a plurality of first conductivity side fine-line electrodes; a second conductivity side connecting electrode formed on the back surface and connected to a plurality of second conductivity side fine-line electrodes; and a light reflection member placed on the light receiving surface, and having light reflection facing the light receiving surface protection member, wherein the light reflection member is positioned on an opposite side to the first conductivity side connecting electrode across the semiconductor substrate.

In the solar cell according to the feature of the present invention, the light reflecting surface is made of any one of a metal layer and a white resin.

In the solar cell according to the feature of the present invention, the light reflection plate includes a base bonded to the light receiving surface.

A method of manufacturing solar cell module according to a feature of the present invention is summarized as including one solar cell and another solar cell sealed between a light receiving surface protection member and a back surface protection member, the method comprising: a step A of forming each of the one solar cell and the other solar cell by preparing a semiconductor substrate of a first conductivity type having a back surface which is provided on an opposite side to a light receiving surface and has a first conductivity side connecting electrode and a second conductivity side connecting electrode formed thereon, with the first conductivity side connecting electrode connected to a plurality of first conductivity side fine-line electrodes, and the second conductivity side connecting electrode connected to a plurality of second conductivity side fine-line electrodes formed on the back surface, and by arranging a light reflection member on the light receiving surface of the semiconductor substrate; a step B of forming a solar cell string by electrically connecting the first conductivity side connecting electrode of the one solar cell and the second conductivity side connecting electrode of the other solar cell by use of a wiring member; and a step C of stacking a first sealing member, the solar cell string, a second sealing member and the back surface protection member in this order on the light receiving surface protection member, wherein in the step A, the light reflection member is arranged on an opposite side to the first conductivity side connecting electrode across the semiconductor substrate, and in the step B and the step C, the one solar cell and the other solar cell are placed so that the light receiving surfaces thereof face downward.

MODES FOR CARRYING OUT THE INVENTION

Hereinafter, embodiments of the present invention will be described by using the drawings. In the following description of the drawings, same or similar reference numerals denote same or similar elements and portions. In addition, it should be noted that the drawings are schematic and ratios of dimensions and the like are different from actual ones. Therefore, specific dimensions and the like should be determined in consideration of the following description. Moreover, the drawings also include portions having different dimensional relationships and ratios from one drawing to another.

First Embodiment

Structure of Solar Cell Module

Figure 1:
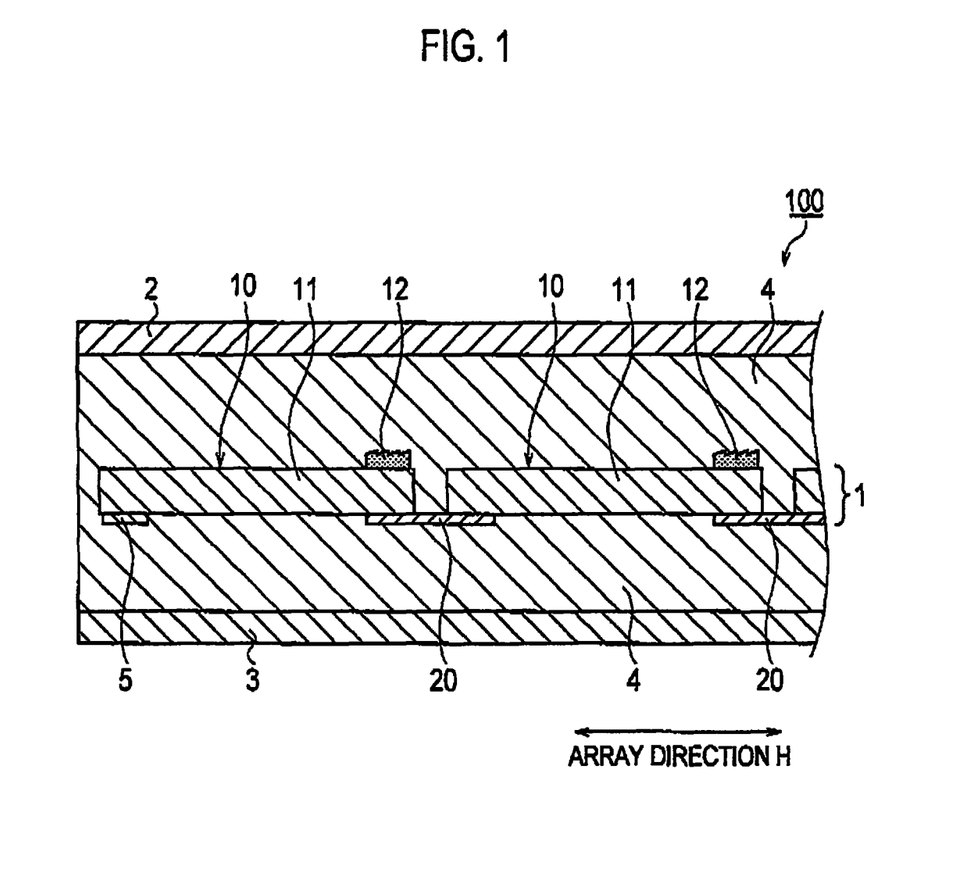
FIG. 1 is a side view of a solar cell module 100 according to a first embodiment of the present invention.
Figure 2:
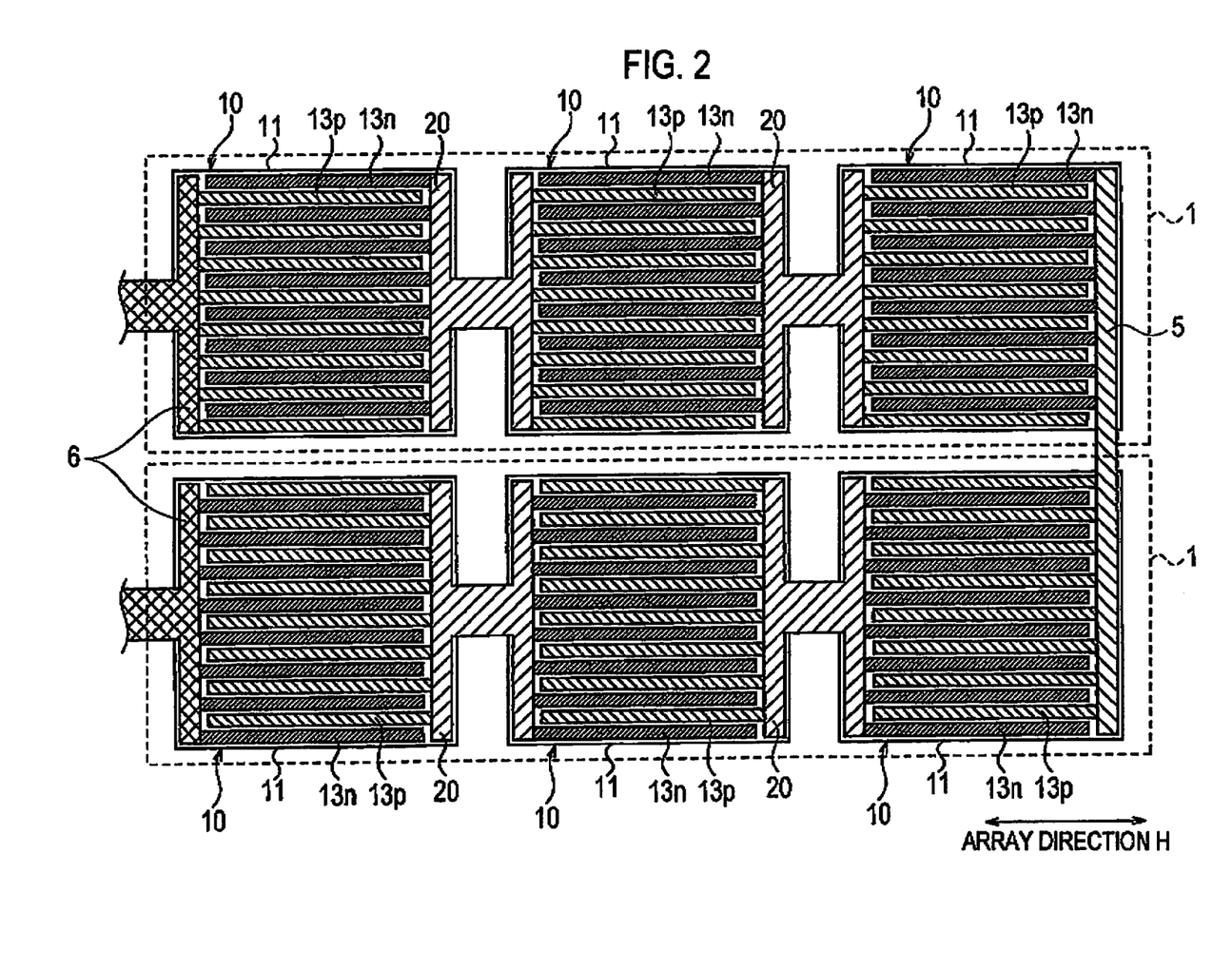
FIG. 2 is a plan view of the solar cell module 100 according to the first embodiment of the present invention when viewed from a back surface side.
Figure 3:
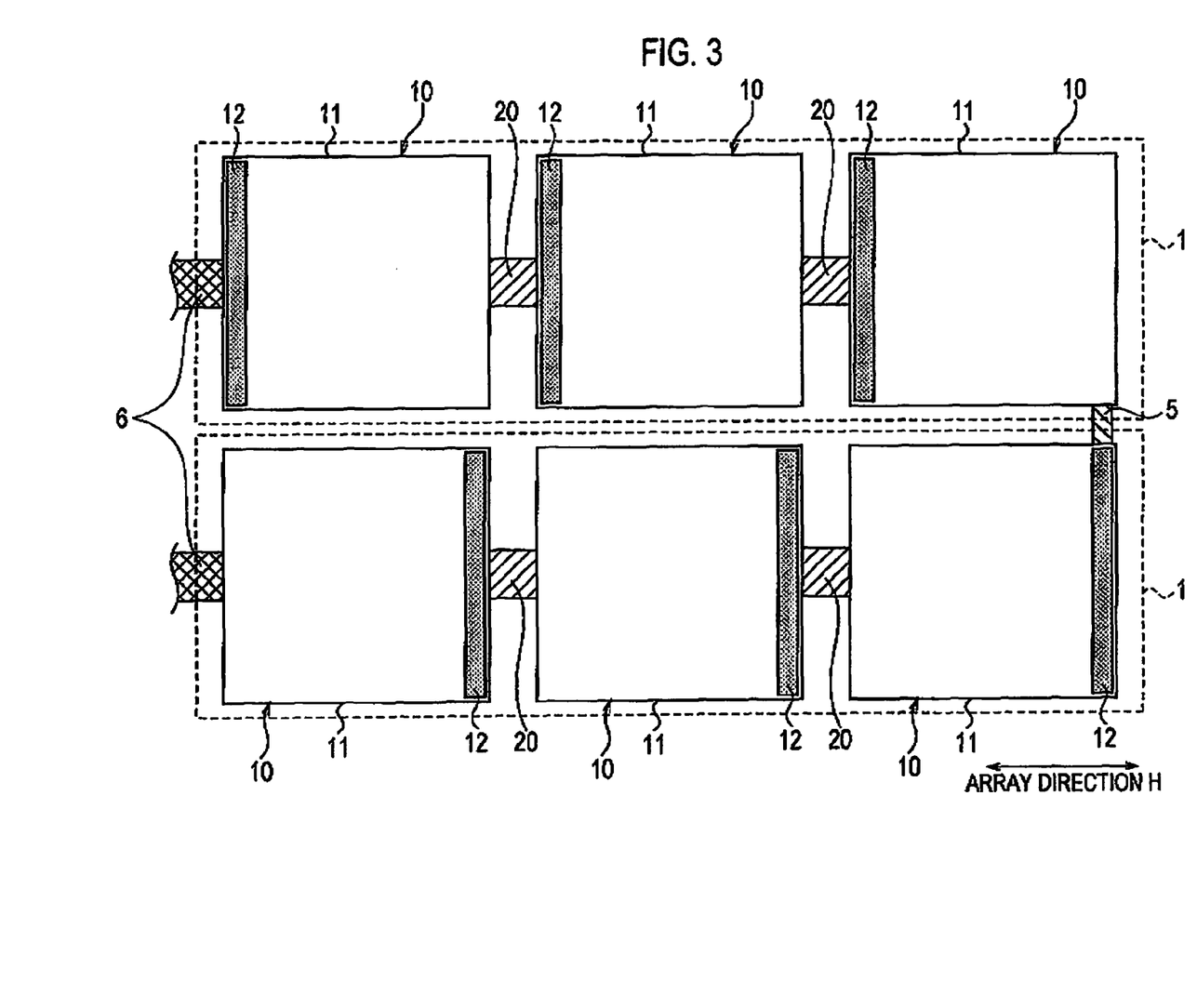
FIG. 3 is a plan view of the solar cell module 100 according to the first embodiment of the present invention when viewed from a light receiving surface side.

With reference to the drawings, description will be hereinbelow provided for a structure of a solar cell module according to a first embodiment of the present invention. FIG. 1 is a side view of a solar cell module 100. FIG. 2 is a plan view of solar cell strings 1 when viewed from a back surface side. FIG. 3 is a plan view of the solar cell strings 1 when viewed from a light receiving surface side.

As shown in FIGS. 1 to 3, the solar cell module 100 includes two solar cell strings 1, a light receiving surface protection member 2, a back surface protection member 3, a sealing member 4, a bridge wiring member 5 and a pair of output leads 6.

The two solar cell strings 1 are sealed by the sealing member 4 between the light receiving surface protection member 2 and the back surface protection member 3. Each of the solar cell strings 1 includes a plurality of solar cells 10 and a plurality of wiring members 20.

The plurality of solar cells 10 are so-called back junction solar cells each including a plurality of n-side fine-line electrodes 13n and a plurality of p-side fine-line electrodes 13p formed on a back surface of an n-type semiconductor substrate 11, as shown in FIG. 2. The solar cells 10 are arrayed in an array direction H. The plurality of solar cells 10 are electrically connected to each other through the plurality of wiring members 20. Each solar cell 10 includes a light reflection member 12 placed on the light receiving surface of the n-type semiconductor substrate 11 as shown in FIG. 3. The structure of the solar cell 10 will be described in details later.

Each of the wiring members 20 electrically connects together one solar cell 10 and another solar cell 10 next to the one solar cell 10. Specifically, one end portion of the wiring member 20 is placed on an n-side connecting electrode 14n (see FIG. 4) of the one solar cell 10. In addition, the other end portion of the wiring member 20 is placed on a p-side connecting electrode 14p (see FIG. 4) of the other solar cell next to the one solar cell 10. A conductive material such as a thin-plate-shaped copper, for example, can be used as the wiring member 20. A surface of such a conductive material may be covered with a soft conductive material such as a lead-free solder (for example, $SnAg_{3.0}Cu_{0.5}$).

The light receiving surface protection member 2 protects the surface of the solar cell module 100. A glass, a light-transmissive plastic or the like having light-transmissive and water blocking properties can be used as the light receiving surface protection member 2.

The back surface protection member 3 protects the back surface of the solar cell module 100. A resin film made of PET (Polyethylene Terephthalate) or the like, a laminate film having a structure in which a metal foil such as an Al foil is sandwiched between resin films, or other similar films can be used as the back surface protection member 3.

The sealing member 4 seals the two solar cell strings 1 between the light receiving surface protection member 2 and the back surface protection member 3. A light-transmissive resin such as an EVA, EEA, PVB, silicon, urethane, acryl, or epoxy resin can be used as the sealing member 4.

The bridge wiring member 5 electrically connects the solar cell strings 1 to each other. Specifically, one end portion of the bridge wiring member 5 is placed on the n-side connecting electrode 14n of the solar cell 10 located at one end of one of the solar cell strings 1. In addition, the other end portion of the bridge wiring member 5 is placed on the p-side connecting electrode 14p of the solar cell 10 located at one end of the other solar cell string 1. The bridge wiring member 5 is made of a material similar to a material for the wiring member 20.

The pair of output leads 6 output electric currents from the two solar cell strings 1 to the outside. The pair of output leads 6 are connected to the pair of solar cells 10, respectively, located at two ends of the respective two solar cell strings 1 connected together with the bridge wiring member 5. Each of the output leads 6 is made of a material similar to a material for the wiring member 20.

Incidentally, an Al flame can be attached to an outer periphery of the solar cell module 100 having the foregoing structure.

(Structure of Solar Cell)

Figure 4:
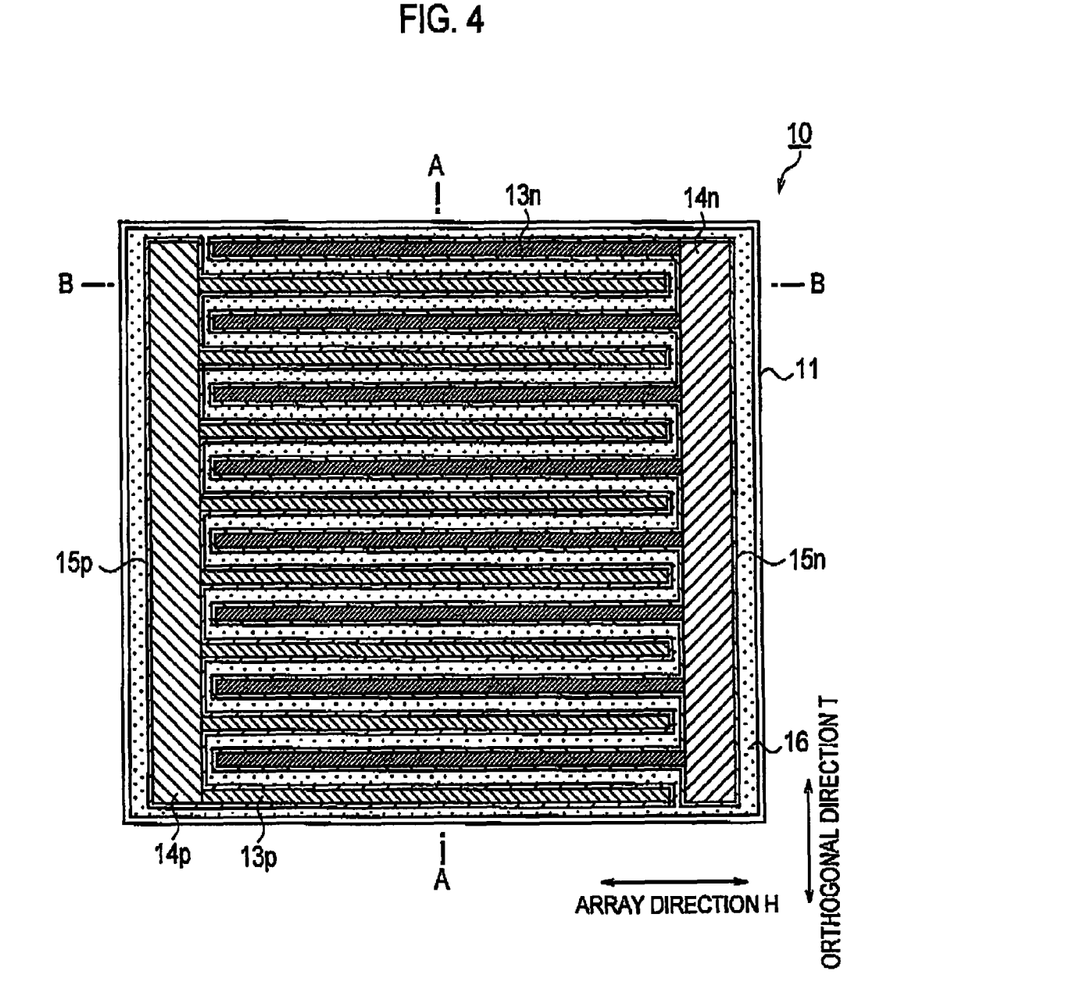
FIG. 4 is a plan view of the back surface side of a solar cell 10 according to the first embodiment of the present invention.
Figure 5:
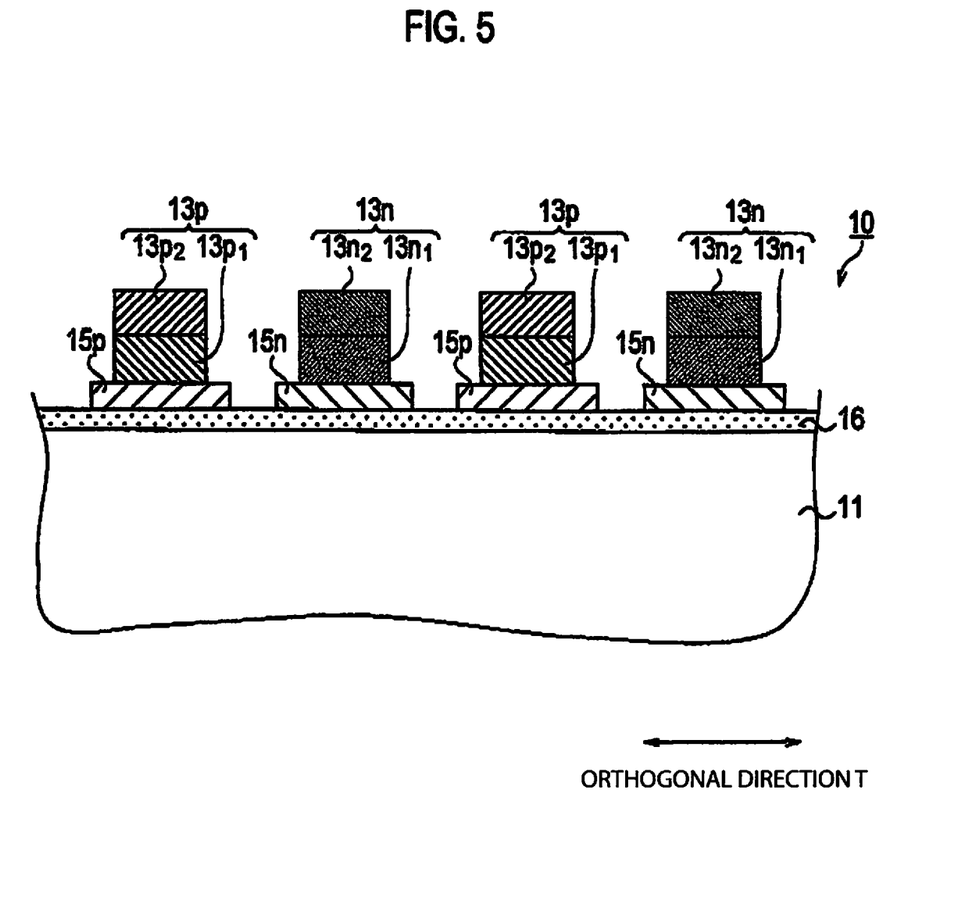
FIG. 5 is an enlarged cross sectional view taken along a line A-A in FIG. 4.

Hereinafter, a structure of the solar cell according to the embodiment of the present invention will be described by referring to the drawings. FIG. 4 is a plan view of the solar cell 10 on the back surface side. FIG. 5 is an enlarged cross sectional view taken along a line A-A in FIG. 4.

As shown in FIG. 4, the solar cell 10 includes an n-type semiconductor substrate 11, a plurality of n-side fine-line electrodes 13n, a plurality of p-side fine-line electrodes 13p, an n-side connecting electrode 14n, a p-side connecting electrode 14p, an n-type amorphous semiconductor layer 15n, a p-type amorphous semiconductor layer 15p, and a passivation layer 16.

The n-type semiconductor substrate 11 has a light receiving surface for receiving light and a back surface provided on the opposite side to the light receiving surface.

The n-type semiconductor substrate 11 according to the present embodiment is made of a semiconductor material doped with an n-type dopant. Materials usable as such a semiconductor material are general semiconductor materials such as crystalline semiconductor materials of single-crystal Si, polycrystalline Si and the like, and compound semiconductor materials of GaAs, InP and the like. The n-type semiconductor substrate 11 generates photogenerated carriers (holes and electrons) by receiving light. Here, since the conductivity of the n-type semiconductor substrate 11 is n type, the photogenerated carriers includes the electrons as majority carriers and the holes as minority carriers.

The plurality of n-side fine-line electrodes 13n are collecting electrodes that collect the electrons from the n-type semiconductor substrate 11. Each of the n-side fine-line electrodes 13n is formed along the array direction H on the back surface of the n-type semiconductor substrate 11 as shown in FIG. 4.

The plurality of p-side fine-line electrodes 13p are collecting electrodes that collect the holes from the n-type semiconductor substrate 11. The p-side fine-line electrodes 13p are formed along the n-side fine-line electrodes 13n on the back surface of the n-type semiconductor substrate 11 as shown in FIG. 4. The n-side fine-line electrodes 13n and the p-side fine-line electrodes 13p are formed alternately into a form of stripes.

Note that, as shown in FIG. 5, each of the n-side fine-line electrodes 13n includes an n-side transparent conductive layer $13n_1$ and an n-side conductive layer $13n_2$. The n-side conductive layer $13n_2$ is formed on the n-side transparent conductive layer $13n_1$. The n-side transparent conductive layer $13n_1$ is formed on the n-type amorphous semiconductor layer 15n. The n-side transparent conductive layer $13n_1$ is formed of an oxide of In, Zn, Sn, Ti, W or the like. The n-side conductive layer $13n_2$ is formed of silver, a resin conductive paste or a sintered conductive paste.

Moreover, as shown in FIG. 5, each of the p-side fine-line electrodes 13p includes a p-side transparent conductive layer $13p_1$ and a p-side conductive layer $13n_2$. The p-side conductive layer $13p_2$ is formed on the p-side transparent conductive layer $13p_1$. The p-side transparent conductive layer $13p_1$ is formed on the p-type amorphous semiconductor layer 15p. The p-side transparent conductive layer $13p_1$ is formed of an oxide of In, Zn, Sn, Ti, W or the like. The p-side conductive layer $13p_2$ is formed of silver, a resin conductive paste or a sintered conductive paste.

The n-side connecting electrode 14n is formed along an orthogonal direction T substantially orthogonal to the array direction H, on one end portion of the n-type semiconductor substrate 11, as shown in FIG. 4. The n-side connecting electrode 14n is connected to the plurality of n-side fine-line electrodes 13n. The n-side connecting electrode 14n is an electrode to which the wiring member 20, the bridge wiring member 5, or the output lead 6 is to be connected. Moreover, the n-side connecting electrode 14n is a collecting electrode for collecting electrons from the n-type semiconductor substrate 11.

The p-side connecting electrode 14p is formed along the orthogonal direction T on another end portion of the n-type semiconductor substrate 11, as shown in FIG. 4. The p-side connecting electrode 14p is connected to the plurality of p-side fine-line electrodes 13p. The p-side connecting electrode 14p is an electrode to which the wiring member 20, the bridge wiring member 5, or the output lead 6 is to be connected. Moreover, the p-side connecting electrode 14p is a collecting electrode for collecting holes from the n-type semiconductor substrate 11.

Figure 7:
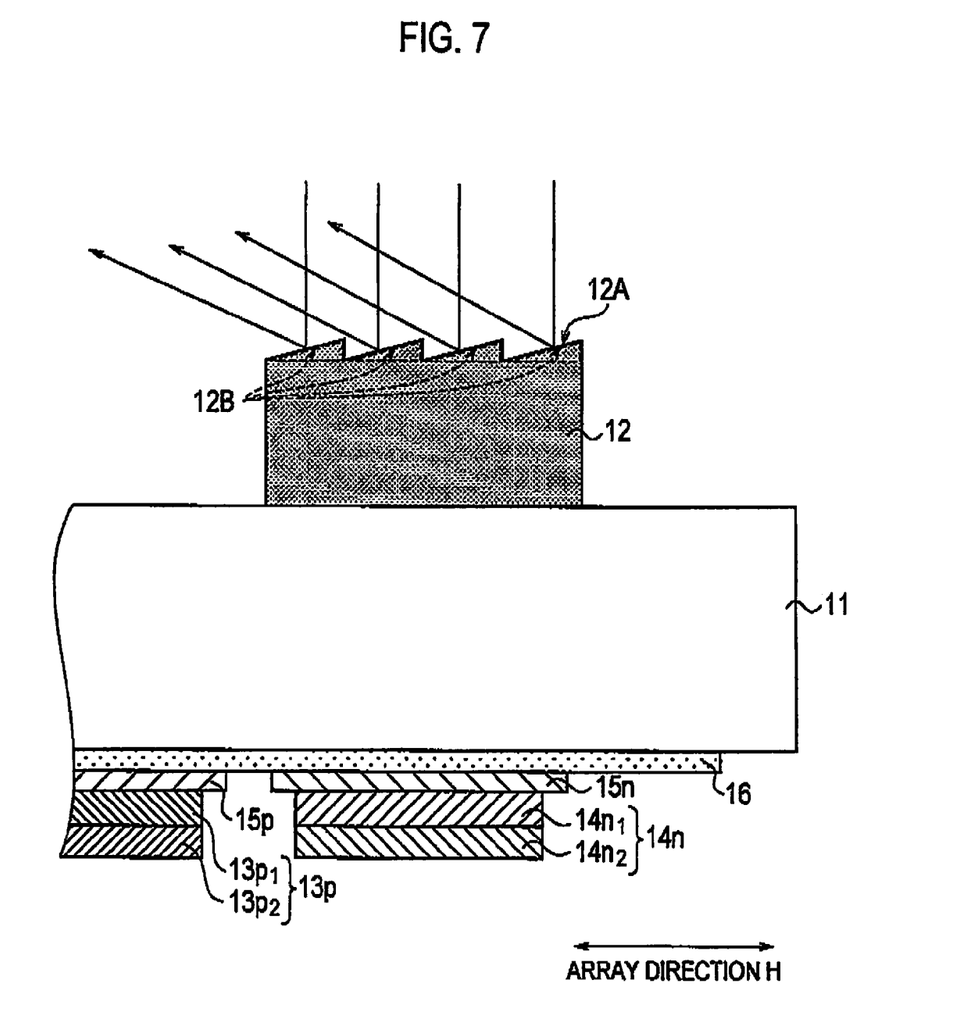
FIG. 7 is an enlarged cross sectional view taken along a line B-B in FIG. 4.

Here, the n-side connecting electrode 14n has a structure similar to the structure of the n-side fine-line electrodes 13n (see FIG. 7). In addition, the p-side connecting electrode 14p has a structure similar to the structure of the p-side fine-line electrodes 13p, though not illustrated.

As shown in FIG. 4, the n-type amorphous semiconductor layer 15n is formed in a comb-like shape on the back surface of the n-type semiconductor substrate 11. The plurality of n-side fine-line electrodes 13n each extending in the array direction H and the n-side connecting electrode 14n extending in the orthogonal direction T are provided on the n-type amorphous semiconductor layer 15n.

As shown in FIG. 4, the p-type amorphous semiconductor layer 15p is formed in a comb-like shape on the back surface of the n-type semiconductor substrate 11. The plurality of p-side fine-line electrodes 13p each extending along the array direction H and the p-side connecting electrode 14p extending along the orthogonal direction T are provided on the p-type amorphous semiconductor layer 15p.

Note that, as shown in FIG. 5, the n-type amorphous semiconductor layer 15n and the p-type amorphous semiconductor layer 15p are formed on the passivation layer 16.

As shown in FIG. 4, the passivation layer 16 is formed to almost entirely cover the back surface of the n-type semiconductor substrate 11. The passivation layer 16 a substantially intrinsic amorphous semiconductor layer (i-type amorphous semiconductor layer) formed without doping of any dopant or with doping of a very small amount of dopant. The passivation layer 16 has passivating properties of inhibiting recombining of carriers.

Figure 6:
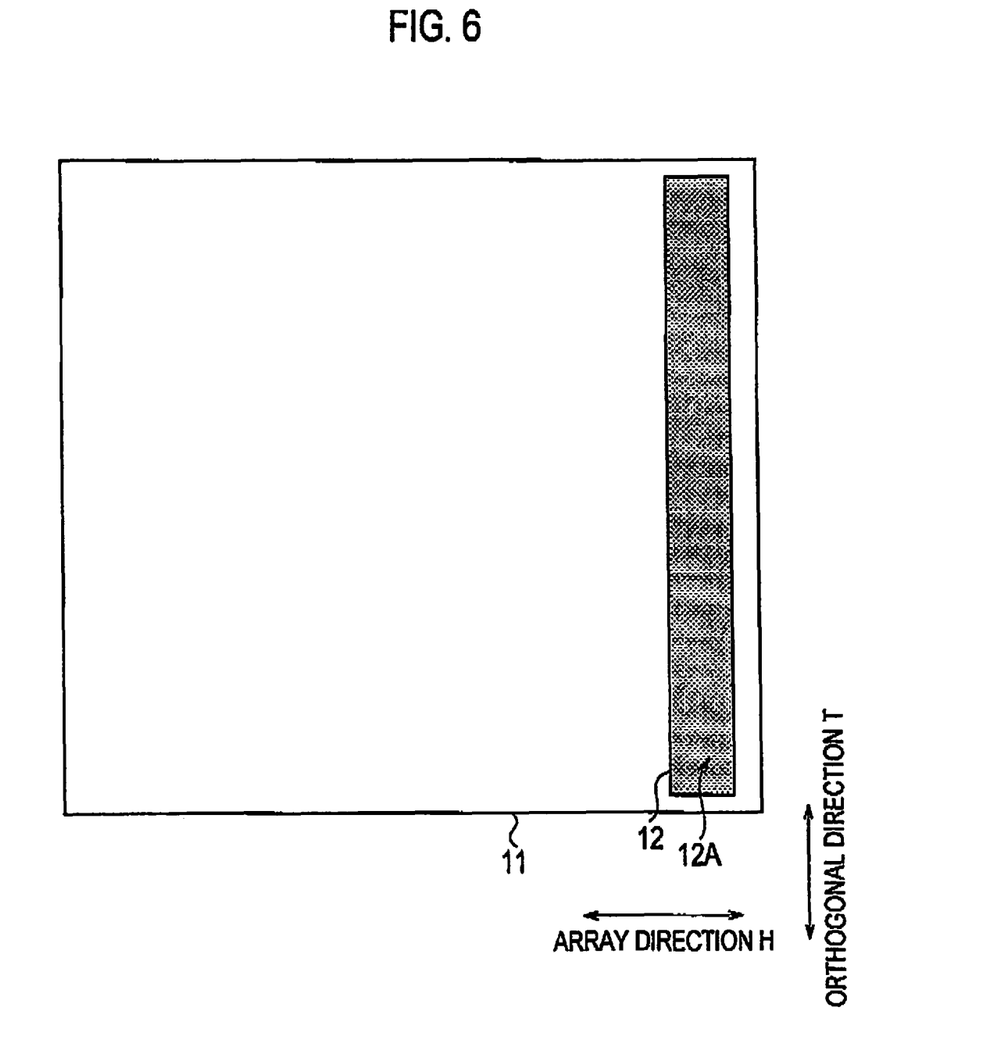
FIG. 6 is a plan view of a light receiving surface side of the solar cell 10 according to the first embodiment of the present invention.

Here, FIG. 6 is a plan view of the solar cell 10 on the light receiving surface side. FIG. 7 is an enlarged cross sectional view taken along the B-B line in FIG. 4.

As shown in FIG. 6, the solar cell 10 includes a light reflection member 12 placed along the orthogonal direction T on one end portion of the light receiving surface of the n-type semiconductor substrate 11. As shown in FIG. 7, the light reflection member 12 is arranged on the opposite side to the n-side connecting electrode 14n across the n-type semiconductor substrate 11. The light reflection member 12 includes a light reflecting surface 12A facing the light receiving surface protection member 2 and having light reflecting properties.

In the present embodiment, the light reflection member 12 includes a base portion bonded onto the light receiving surface, a light reflecting layer formed on the base portion, and an oxidation/sulfuration prevention layer formed on the light reflecting layer.

The base portion is formed of a general resin, glass, ceramic or metal material. A linear expansion coefficient of the base portion is preferably close to a linear expansion coefficient of the n-type semiconductor substrate 11. Having this linear expansion coefficient, the base portion can be prevented from removing from the light receiving surface of the n-type semiconductor substrate 11 due to expansion and shrinkage of the base portion along with thermal cycles.

The light reflecting layer reflects incident light toward the light reflection member 12. The light reflecting layer is made of, for example, a metal material such as Ag, Al, stainless, Au, Pt, or Ni, an alloy material of any of these metal materials containing a lanthanoid such as Nd, a white resin material, or the like. The light reflecting layer described above gives the light reflecting properties to the light reflecting surface 12A. Incidentally, in the case of the light reflecting layer made of any of the above metal material, the light reflecting layer may have a thickness of approximately 100 nm.

Here, in the present embodiment, a bumpy structure 12B is formed in the light reflecting surface 12A as shown in FIG. 7. A reflecting direction of the light reflecting surface 12A is changeable appropriately with a change in an inclination of the bumpy structure 12B. In the present embodiment, the incident light falling on the light reflecting surface 12A is reflected toward the other end portion of the n-type semiconductor substrate 11 by the bumpy structure 12B, and thereafter is again reflected by an interface between the light receiving surface protection member 2 and the outside air. With this, the incident light falling on a region of the light receiving surface on the opposite side to the n-side connecting electrode 14n is guided to a region of the light receiving surface on the opposite side to the plurality of n-side fine-line electrodes 13n and the plurality of p-side fine-line electrodes 13p.

Incidentally, the light reflection member 12 may include at least a light reflecting layer forming the light reflecting surface 12A, and may not include either the base portion or the oxidation/sulfuration prevention layer. In this case, the light reflecting layer may be formed directly on the light receiving surface of the n-type semiconductor substrate 11 or may be bonded onto the light receiving surface of the n-type semiconductor substrate 11.

(Solar Cell Manufacturing Method)

Next, a manufacturing method of the solar cell module 100 is described.

First of all, a substantially intrinsic amorphous semiconductor layer is formed on the almost entire back surface of the n-type semiconductor substrate 11 by using the CVD method. In this way, the passivation layer 16 is formed.

Then, the n-type amorphous semiconductor layer 15n is formed by using the CVD method with a predetermined region on the passivation layer 16 covered with a shadow mask. Subsequently, the p-type amorphous semiconductor layer 15p is formed by using the CVD method with a predetermined region on the passivation layer 16 covered with a shadow mask.

Thereafter, ITO, for example, is sputtered on the n-type amorphous semiconductor layer 15n and the p-type amorphous semiconductor layer 15p. In this way, the n-side transparent conductive layer $13n_1$ and the p-side transparent conductive layer $13p_1$ are formed. After that, a resign conductive paste, for example, is printed on the n-side transparent conductive layer $13n_1$ and the p-side transparent conductive layer $13p_1$. In this way, the n-side conductive layer $13n_2$ and the p-side conductive layer $13p_2$ are formed. In this way, the plurality of n-side fine-line electrodes 13n, the n-side connecting electrode 14n, the plurality of p-side fine-line electrodes 13p and the p-side connecting electrode 14p are formed on the back surface of the n-type semiconductor substrate 11.

Subsequently, the light receiving surface of the n-type semiconductor substrate 11 is turned upward, and the light reflection member 12 is placed on the light receiving surface. In this case, the light reflection member 12 is arranged on the opposite side to the n-side connecting electrode 14n across the n-type semiconductor substrate 11.

The plurality of solar cells 10 are formed by repeatedly performing the above steps.

Then, the light receiving surface of the n-type semiconductor substrate 11 is turned downward and the wiring members 20 are connected to the back surface of the n-type semiconductor substrate 11. The solar cell string 1 is formed by electrically connecting the solar cells 10 to each other.

Next, the two solar cell strings 1 are electrically connected to each other through the bridge wiring member 5. Then, the pair of output leads 6 are respectively connected to the pair of solar cells 10 located at the two end portions of the respective two solar cell strings 1.

Subsequently, the sealing member 4, the two solar cell strings 1, the sealing member 4, and the back surface protection member 3 are stacked in this order on the light receiving surface protection member 2. In this case, the light receiving surfaces of the n-type semiconductor substrates 11 are turned downward to face the sealing member 4.

Next, the sealing member 4 is heated and thereby is cured.

(Operations and Effects)

In the solar cell module 100 according to the present embodiment, the light reflection member 12 is positioned on the opposite side to the n-side connecting electrode 14n across the n-type semiconductor substrate 11.

Hence, incident light falling on the region of the light receiving surface on the opposite side to the n-side connecting electrode 14n can be guided to the region of the light receiving surface on the opposite side to the plurality of n-side fine-line electrodes 13n and the plurality of p-side fine-line electrodes 13p. Thus, carrier generation is promoted in the proximity of the fine-line electrodes where the diffusion length is so short that minority carriers can be effectively collected. For this reason, the incident light can be more effectively utilized than in the case where the incident light is absorbed by the region on the opposite side to the n-side connecting electrode 14n. Consequently, the conversion efficiency of the solar cell 10 can be improved.

In addition, in the present embodiment, the light reflection member 12 placed on the one end portion of the n-type semiconductor substrate 11 reflects light toward the other end portion of the n-type semiconductor substrate 11. Thus, the incident light falling on the light reflection member 12 can be efficiently introduced into the light receiving surface of the n-type semiconductor substrate 11. For this reason, the incident light falling on the region on the opposite side to the n-side connecting electrode 14n can be more effectively utilized.

Moreover, in the present embodiment, in the step of forming the solar cell string 1 and the step of placing the two solar cell strings on the sealing member 4, the light receiving surface of the n-type semiconductor substrate 11 is placed to face downward. Thus, the solar cell string 1 does not have to be turned upside down between the two steps. Consequently, the productivity of the solar cell module 100 can be improved.

Second Embodiment

Structure of Solar Cell Module

Figure 8:
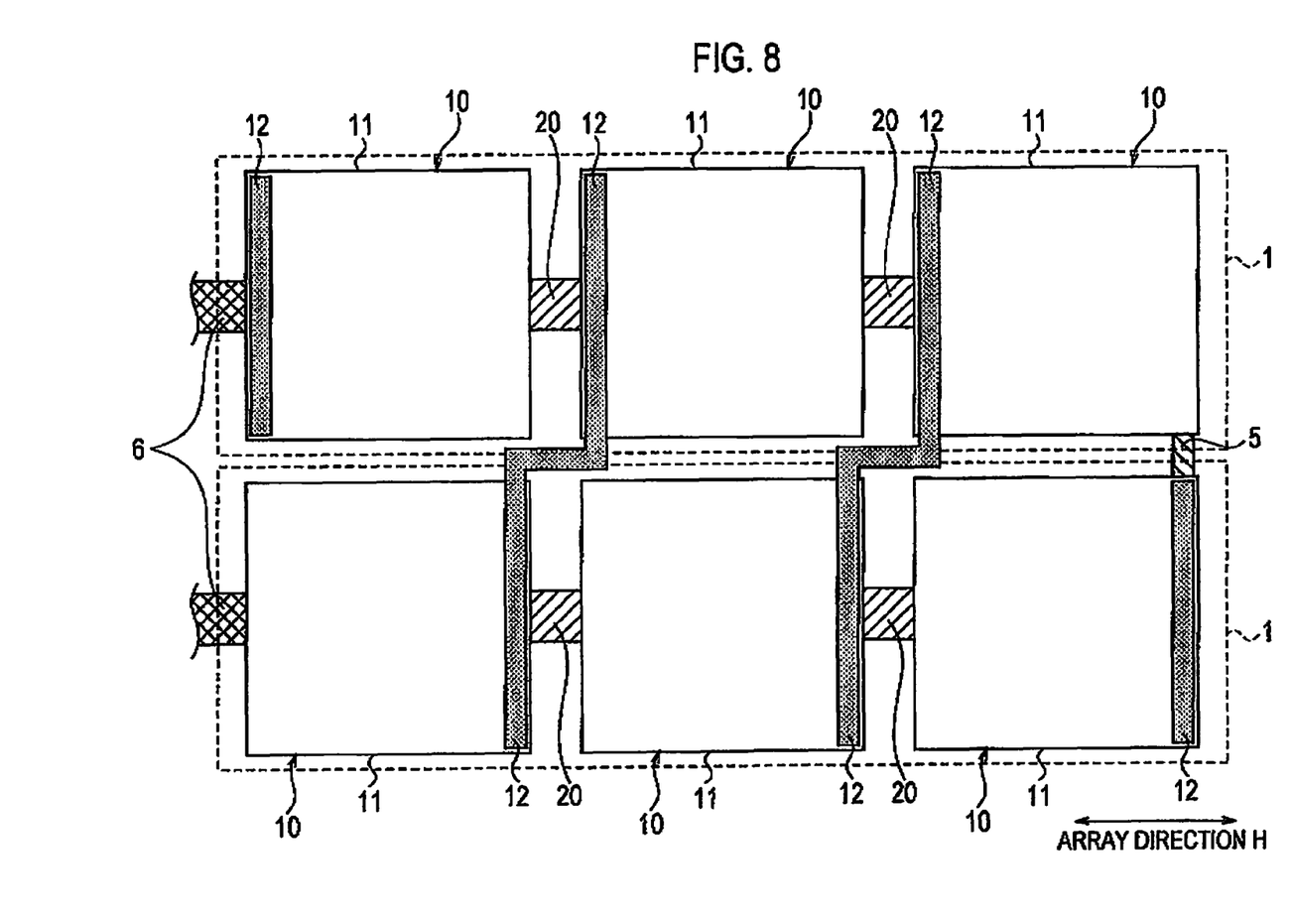
FIG. 8 is a plan view of solar cell strings 1 according to a second embodiment of the present invention when viewed from a light receiving surface side.

Hereinafter, a structure of a solar cell module according to a second embodiment in the present invention will be described by referring to the drawings. Note that, the following description is provided mainly for a different point from the aforementioned first embodiment. Specifically, a light reflection member 12 is placed over a plurality of solar cells 10.

FIG. 8 is a plan view of a solar cell string 1 according to the second embodiment when viewed from the light receiving surface side. As shown in FIG. 8, a light reflection member 12 of one solar cell 10 and a light reflection member 12 of another solar cell 10 are formed as a single unit.

Accordingly, the step of placing the light reflection member 12 on the light receiving surface of the n-type semiconductor substrate 11 can be simplified. Consequently, the productivity of the solar cell module 100 can be improved.

Note that, in terms of the structure and other points of the solar cell 10, the present embodiment is the same as the aforementioned first embodiment.

Third Embodiment

Structure of Solar Cell Module

Figure 9:
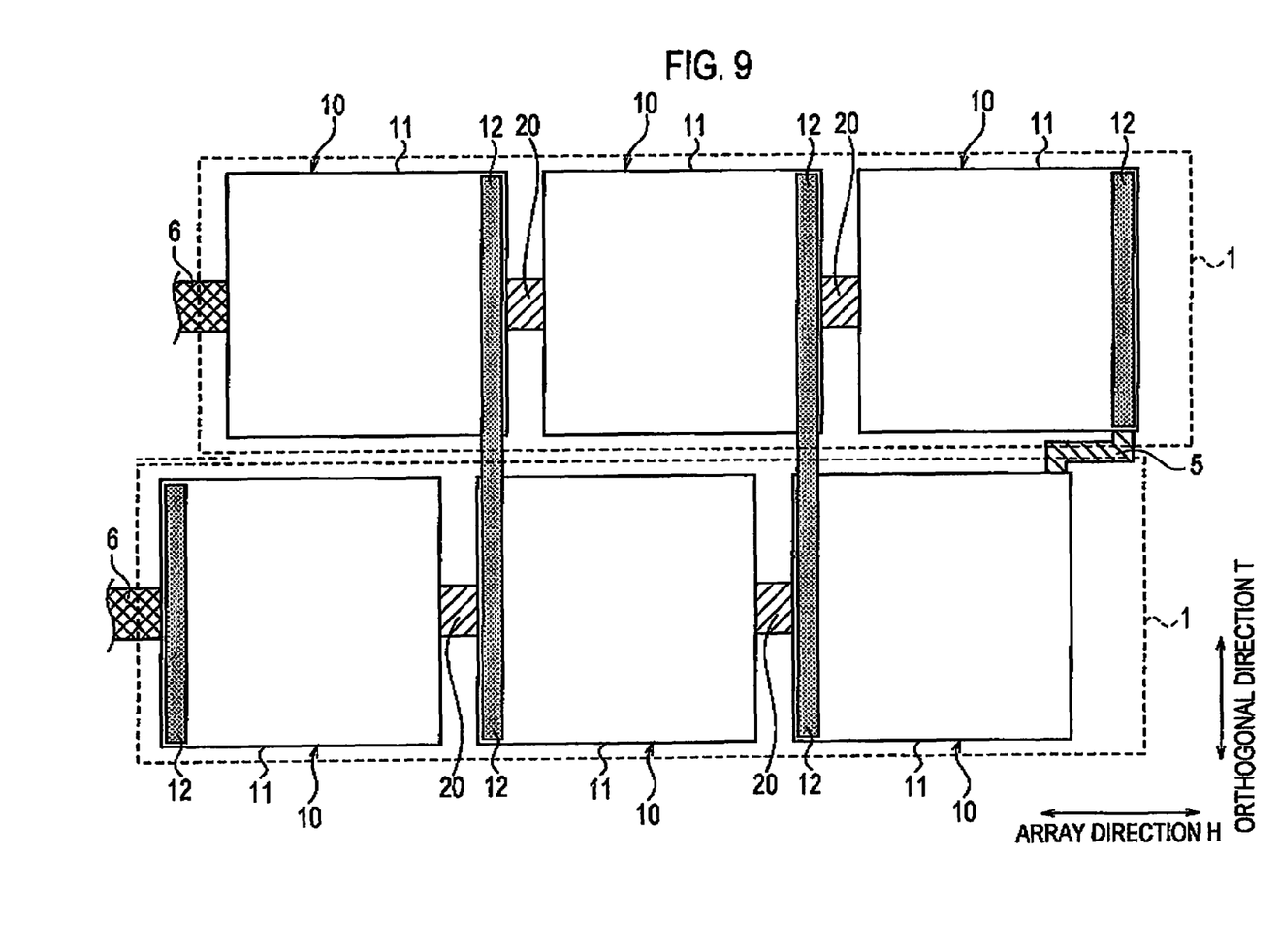
FIG. 9 is a plan view of solar cell strings 1 according to a third embodiment of the present invention when viewed from a light receiving surface side.

Hereinafter, a structure of a solar cell module according to a third embodiment in the present invention will be described by referring to the drawings. Note that, the following description is provided mainly for a different point from the aforementioned second embodiment. Specifically, a light reflection member 12 has a rectangular planar shape.

FIG. 9 is a plan view of a solar cell string 1 according to the third embodiment when viewed from the light receiving surface side. As shown in FIG. 9, a light reflection member 12 of one solar cell 10 and a light reflection member 12 of another solar cell 10 are formed integrally as a single unit. In addition, the integrally-formed light reflection member 12 is formed in a rectangular shape and is placed along the orthogonal direction T.

Such light reflection members 12 can be formed by cutting a long light reflection member at predetermined intervals. Thus, the light reflection members 12 can be manufactured simply. In addition, since the light reflection member 12 is formed in a line shape, the handling properties of the light reflection members 12 can be improved.

Other Embodiments

As described above, the details of the present invention have been disclosed by using the embodiments of the present invention. However, it should not be understood that the description and drawings which constitute part of this disclosure limit the present invention. From this disclosure, various alternative embodiments, examples, and operation techniques will be easily found by those skilled in the art.

For example, the n-type semiconductor substrate 11 having an n-type conductivity is used in the foregoing embodiments, but a p-type semiconductor substrate may be used. In this case, many of electrons (minority carriers) generated around the p-side connecting electrode 14p may be highly possibly recombined with holes (majority carriers) before being diffused into the n-side fine-line electrode 13n. For this reason, the light reflection member 12 is arranged on the opposite side to the p-side connecting electrode 14p across the p-side semiconductor substrate.

Figure 10:
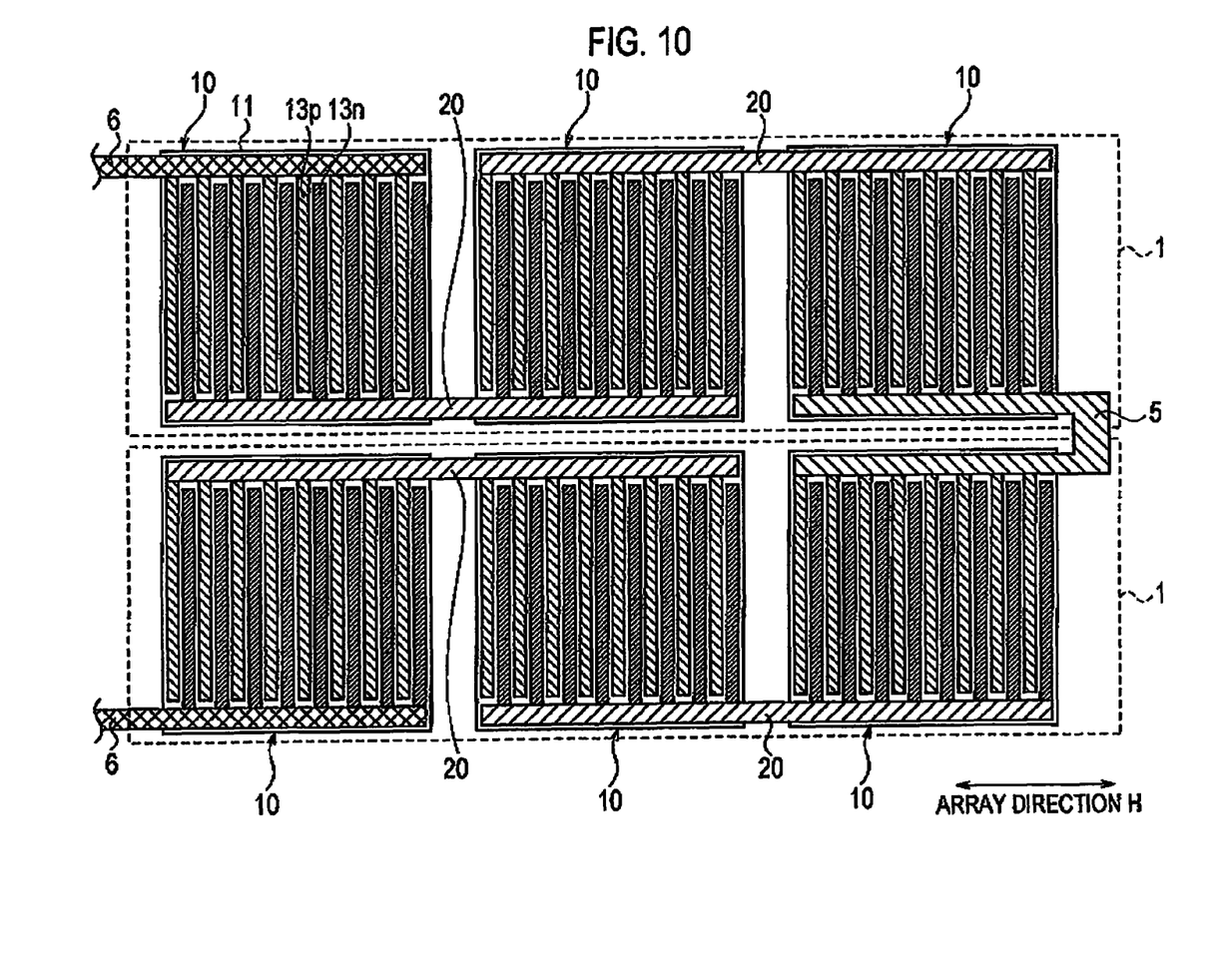
FIG. 10 is a plan view of solar cell strings 1 according to an embodiment of the present invention when viewed from a back surface side.
Figure 11:
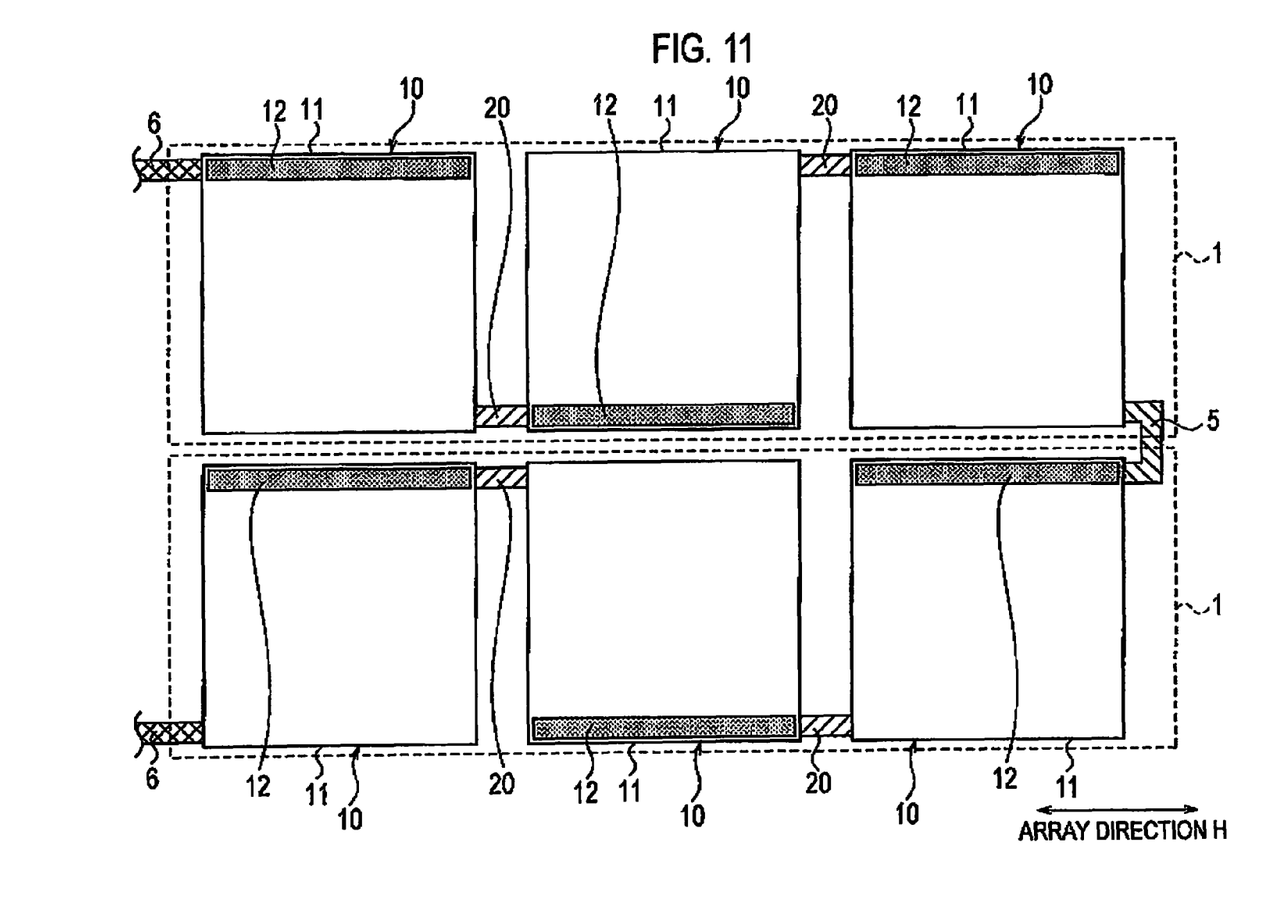
FIG. 11 is a plan view of solar cell strings 1 according to an embodiment of the present invention when viewed from a receiving surface side.
Figure 12:
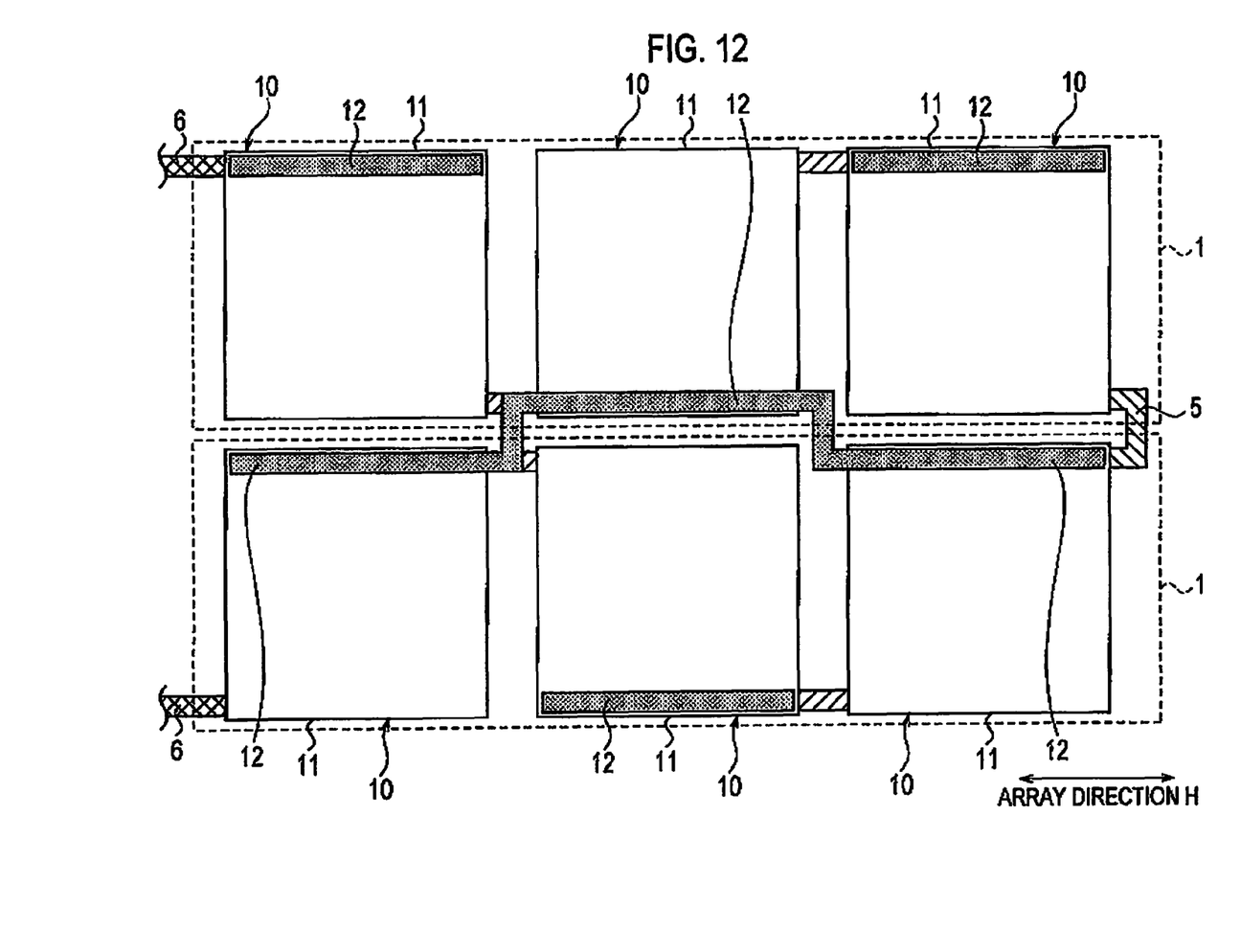
FIG. 12 is a plan view of solar cell strings 1 according to an embodiment of the present invention when viewed from a receiving surface side.

Additionally, in the foregoing embodiments, each of the fine-line electrodes is formed along the array direction H, and each of the connecting electrodes is formed along the orthogonal direction T. However, the structure is not limited to this. For example, each of the fine-line electrodes may be formed along the orthogonal direction T and each of the connecting electrodes may be formed along the array direction H. To be more specific, as shown in FIG. 10, the wiring members 20, the bridge wiring member 5 and the output leads 6 are each placed along the array direction H on the back surface of the n-type semiconductor substrate 11. In addition, as shown in FIG. 11, the light reflection member 12 is placed along the array direction H. In this case, as shown in FIG. 12, light reflection members 12 belonging to a plurality of solar cells 10 may be formed integrally as a single unit.

Moreover, in the aforementioned embodiments, each of the solar cell strings 1 is formed after the light reflection member 12 is placed on the light receiving surface of the n-type semiconductor substrate 11. However, the manufacturing method is not limited to this. For example, the light reflection member 12 may be placed on the sealing member 4 and then the solar cell string 1 may be placed thereon. In this case, a recessed portion having such a size that the solar cell string 1 can be fitted into the recessed portion may be formed in the sealing member 4 and the light reflection member 12 may be placed in the recessed portion in advance. Here, the light reflection member 12 may be bonded to the sealing member 4 in advance by preparatory bonding with the light reflection member 12 partially heated.

In addition, though not particularly mentioned in the foregoing embodiments, a passivation layer may be formed on the light receiving surface of the n-type semiconductor substrate 11. An i-type amorphous semiconductor layer, a thermally-oxidized film, or the like may be used as such a passivation layer.

Further, though not particularly mentioned in the foregoing embodiments, a texture structure may be provided to the light receiving surface and the back surface of the n-type semiconductor substrate 11.

Additionally, the foregoing embodiments have been described by taking as an example a film-formation type solar cell in which the n-type amorphous semiconductor layer 15n and the p-type amorphous semiconductor layer 15p are formed on the n-type semiconductor substrate 11 by using the masks. However, a diffusion type solar cell may be used in which a p-type region and n-type region are formed inside the n-type semiconductor substrate 11.

Moreover, in the foregoing embodiments, the n-type amorphous semiconductor layer 15n and the p-type amorphous semiconductor layer 15p are patterned by using the masks. Nevertheless, the n-type amorphous semiconductor layer 15n and the p-type amorphous semiconductor layer 15p may be patterned by using an etching paste or a resist film.

Further, the aforementioned embodiments use the light reflection member 12. However, a diffusion material may be used to produce the same effects.

Furthermore, in the foregoing embodiments, the bumpy structure 12B is formed in the light reflecting surface 12A. The structure, however, is not limited to this. For example, the light reflecting surface 12A may be formed to have a planar shape and to be inclined downward toward the other end portion of the semiconductor substrate. In this case, the light reflecting surface 12A can evenly reflect incident light toward the other end portion of the semiconductor substrate.

Still further, in the foregoing embodiments, the cross section of the bumpy structure 12B has an acute angled shape, but is not limited to this. The cross section of the bumpy structure 12B may have any shape as long as the shape allows light to be reflected well by the interface between the light receiving surface protection member 2 and the air, and may have a semicircular shape, for example.

As described above, the present invention naturally includes various embodiments which are not described herein. Accordingly, the technical scope of the present invention should be determined only by the matters to define the invention in the scope of claims regarded as appropriate based on the description.

Note that the entire content of Japanese Patent Application No. 2008-214525 (filed on Aug. 22, 2008) is incorporated herein by reference.

INDUSTRIAL APPLICABILITY

The solar cell module according to the present invention is usable in photovoltaic power generation since the module can effectively utilize incident light as described above.

The invention claimed is:

1. A solar cell module comprising first and second solar cells sealed between a light receiving surface protection member and a back surface protection member,
wherein each of the first and second solar cells comprises:
a semiconductor substrate of a first conductivity type having a light receiving surface and a back surface provided on an opposite side to the light receiving surface;
a first conductivity side connecting electrode formed as an array at one end portion of the semiconductor substrate on the back surface and connected to a plurality of first conductivity side fine-line electrodes;
a second conductivity side connecting electrode formed as an array at another end portion of the semiconductor substrate on the back surface and connected to a plurality of second conductivity side fine-line electrodes, wherein the first conductivity side fine-line electrodes and the second conductivity side fine-line electrodes are formed alternately as stripes; and
a light reflection member placed on the light receiving surface and having a light reflecting surface facing the light receiving surface protection member,
wherein the light reflection member is positioned on an opposite side to the first conductivity side connecting electrode across the semiconductor substrate,
wherein the first conductivity side connecting electrode is formed on a first end portion of the semiconductor substrate,
wherein the light reflection member reflects incident light falling on the light reflection member toward a second portion of the semiconductor substrate,
wherein incident light on the light reflection member is guided to the region of the light receiving surface that has the first conductivity side fine-line electrodes,
wherein the first and the second conductivity side fine-line electrodes are formed along a direction substantially orthogonal to the array of first and the second conductivity side connecting electrodes, and
wherein the light reflection member included in the first solar cell and the light reflection member included in the second solar cell are formed integrally as a single unit.

2. The solar cell module according to claim 1, wherein the light reflecting surface is made of any one of a metal layer and a white resin.

3. The solar cell module according to claim 1, wherein the light reflection member includes a base bonded to the light receiving surface.

* * * * *